US009461594B2

(12) United States Patent
Tabei

(10) Patent No.: US 9,461,594 B2
(45) Date of Patent: Oct. 4, 2016

(54) POWER AMPLIFIER MODULE

(71) Applicant: Murata Manufacturing Co., Ltd., Kyoto (JP)

(72) Inventor: Makoto Tabei, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/589,376

(22) Filed: Jan. 5, 2015

(65) Prior Publication Data
US 2015/0222234 A1 Aug. 6, 2015

(30) Foreign Application Priority Data

Feb. 4, 2014 (JP) .................................. 2014-019710

(51) Int. Cl.
*H03F 1/02* (2006.01)
*H03F 3/45* (2006.01)
*H03F 3/193* (2006.01)
(Continued)

(52) U.S. Cl.
CPC ........... *H03F 1/0211* (2013.01); *H03F 1/0266* (2013.01); *H03F 1/301* (2013.01); *H03F 1/56* (2013.01); *H03F 3/193* (2013.01); *H03F 3/195* (2013.01); *H03F 3/211* (2013.01); *H03F 3/24* (2013.01); *H03F 3/45179* (2013.01); *H03F 3/45475* (2013.01); *H03F 3/72* (2013.01); *H03F 2200/222* (2013.01); *H03F 2200/318* (2013.01); *H03F 2200/387* (2013.01); *H03F 2200/447* (2013.01); *H03F 2200/451* (2013.01); *H03F 2200/555* (2013.01); *H03F 2203/45112* (2013.01); *H03F 2203/45528* (2013.01); *H03F 2203/45536* (2013.01); *H03F 2203/7206* (2013.01); *H03F 2203/7215* (2013.01)

(58) Field of Classification Search
USPC .......................... 330/285, 296–297, 289, 278
See application file for complete search history.

(56) References Cited

U.S. PATENT DOCUMENTS 8,008,974 B2 * 8/2011 Ha ......................... H03F 1/0261
330/278
8,816,774 B2 * 8/2014 Shinichi .................. H03F 1/223
330/285

(Continued)

FOREIGN PATENT DOCUMENTS

JP H03-065715 A 3/1991
JP 2002-3335135 A 11/2002

(Continued)

OTHER PUBLICATIONS

Notice of Reasons for Rejection issued in Japanese Patent Application No. 2014-019710 dated Dec. 17, 2015.

*Primary Examiner* — Hieu Nguyen
(74) *Attorney, Agent, or Firm* — Pearne & Gordon LLP

(57) ABSTRACT

Consumption current may be reduced in a power amplifier module in which a power supply voltage supplied to a power amplification transistor is controlled according to the level of output power. The power amplifier module includes an amplification transistor supplied with the power supply voltage according to the level of output power to amplify a radio-frequency signal, a bias control circuit for generating a bias voltage according to the power supply voltage, and a bias circuit for supplying a bias current according to the bias voltage to the amplification transistor, wherein current flowing through the amplification transistor when the radio-frequency signal is not input is varied according to the level of output power.

21 Claims, 10 Drawing Sheets

(51) Int. Cl.
   *H03F 3/21*    (2006.01)
   *H03F 1/30*    (2006.01)
   *H03F 1/56*    (2006.01)
   *H03F 3/195*   (2006.01)
   *H03F 3/24*    (2006.01)
   *H03F 3/72*    (2006.01)

(56) References Cited

U.S. PATENT DOCUMENTS

2004/0164803 A1   8/2004   Canyon et al.

2012/0306579 A1   12/2012   Okamura et al.

FOREIGN PATENT DOCUMENTS

| | | |
|---|---|---|
| JP | 2003-110373 A | 4/2003 |
| JP | 2005-027130 A | 1/2005 |
| JP | 2006-270146 A | 10/2006 |
| JP | 2007-081561 A | 3/2007 |
| JP | 2009-212870 A | 9/2009 |
| JP | 2012-249231 A | 12/2012 |

\* cited by examiner

POWER AMPLIFIER MODULE

BACKGROUND OF THE INVENTION

1. Field of the Invention

The present invention relates to a power amplifier module.

2. Background Art

In a mobile communication device such as a mobile phone, a power amplifier module is used to amplify the power of a signal to be transmitted to a base station. Patent Document 1 discloses a configuration for variably controlling a power supply voltage supplied to a power amplification transistor in such a power amplifier module according to the level of required output power.

Patent Document 2 discloses a configuration for controlling a bias current in a power amplifier module. Specifically, in the configuration disclosed in Patent Document 2, when the peak value of collector voltage of a power amplification transistor becomes higher than a preset voltage due to a load variation, a bias circuit is controlled to increase the bias current.

CITATION LIST

Patent Documents

[Patent Document 1] JP 2006-270146 A
[Patent Document 2] JP 2007-81561 A

SUMMARY OF THE INVENTION

In the configuration disclosed in Patent Document 1, the power supply voltage is controlled according to the level of required output power, but the control of bias current is not considered. In other words, in the configuration disclosed in Patent Document 1, the reduction in current (idle current) flowing through the power amplification transistor during a no-signal condition is not considered. In the configuration disclosed in Patent Document 2, the control of bias current is performed only when the load is changed, and the reduction in idle current is not considered.

The present invention has been made in view of these circumstances, and consumption current may be reduced in a power amplifier module in which a power supply voltage supplied to a power amplification transistor is controlled according to the level of output power.

A power amplifier module according to one aspect of the present invention includes an amplification transistor supplied with a power supply voltage according to the level of output power to amplify a radio-frequency signal, a bias control circuit for generating a bias voltage according to the power supply voltage, and a bias circuit for supplying a bias current according to the bias voltage to the amplification transistor, wherein current flowing through the amplification transistor when the radio-frequency signal is not input is varied according to the level of output power.

According to the present invention, consumption current can be reduced in the power amplifier module in which the power supply voltage supplied to the power amplification transistor is controlled according to the level of output power.

DESCRIPTION OF THE PREFERRED EMBODIMENTS

Figure 1:
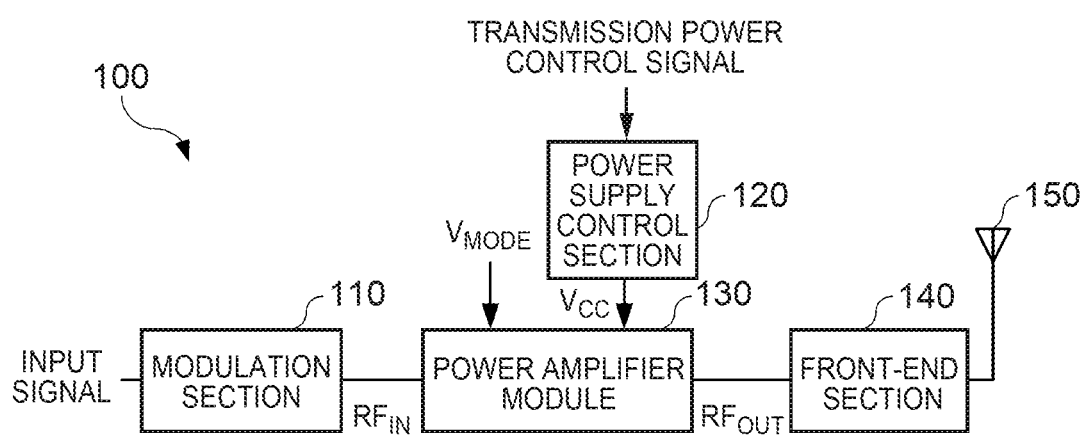
FIG. 1 is a diagram showing a configuration example of a transmitting unit including a power amplifier module according to one embodiment of the present invention.

One embodiment of the present invention will be described below with reference to the accompanying drawings. FIG. 1 is a diagram showing a configuration example of a transmitting unit including a power amplifier module as one embodiment of the present invention. A transmitting unit 100 is used, for example, in a mobile communication device such as a mobile phone, to transmit various signals such as voice and data to a base station. Note that the mobile communication device also has a receiving unit for receiving signals from the base station, but the description thereof will be omitted here.

As shown in FIG. 1, the transmitting unit 100 is configured to include a modulation section 110, a power supply control section 120, a power amplifier module 130, a front-end section 140, and an antenna 150.

The modulation section 110 modulates an input signal based on a modulation scheme such as HSUPA (High Speed Uplink Packet Access) or LTE (Long Term Evolution) to generate a radio frequency (RF) signal for radio transmission. For example, the RF signal is in a range of several hundred MHz to several GHz.

The power supply control section 120 controls the level of power supply voltage $V_{CC}$ supplied to the power amplifier module 130 based on a transmission power control signal. For example, the power supply control section 120 generates a power supply voltage $V_{CC}$ according to a level of output power (power level) of the power amplifier module 130. Specifically, the power supply voltage $V_{CC}$ increases as the level of output power increases. For example, the power supply control section 120 can include a DC-DC converter for generating a target level of power supply voltage $V_{CC}$ from a battery voltage. The transmission power control signal is generated based on, for example, an adaptive power control (APC) signal transmitted from the base station. For example, the base station can measure a signal from the mobile communication device to transmit the APC signal to the mobile communication device as a command for adjusting transmission power in the mobile communication device to an appropriate level.

The power amplifier module 130 amplifies the power of an RF signal ($RF_{IN}$) output from the modulation section 110 to a level required for transmission to the base station, and outputs an amplified signal ($RF_{OUT}$). The power supply voltage $V_{CC}$ supplied to the power amplifier module 130 is controlled by the power supply control section 120. The power amplifier module 130 operates in a power mode according to a power mode control voltage $V_{MODE}$ for controlling the power mode. For example, the power modes include a low power mode (LPM) and a high power mode (HPM).

The front-end section 140 performs filtering for amplified signals, switching from/to signals received from the base station, and the like. The amplified signal output from the front-end section 140 is transmitted to the base station through the antenna 150.

Figure 2:
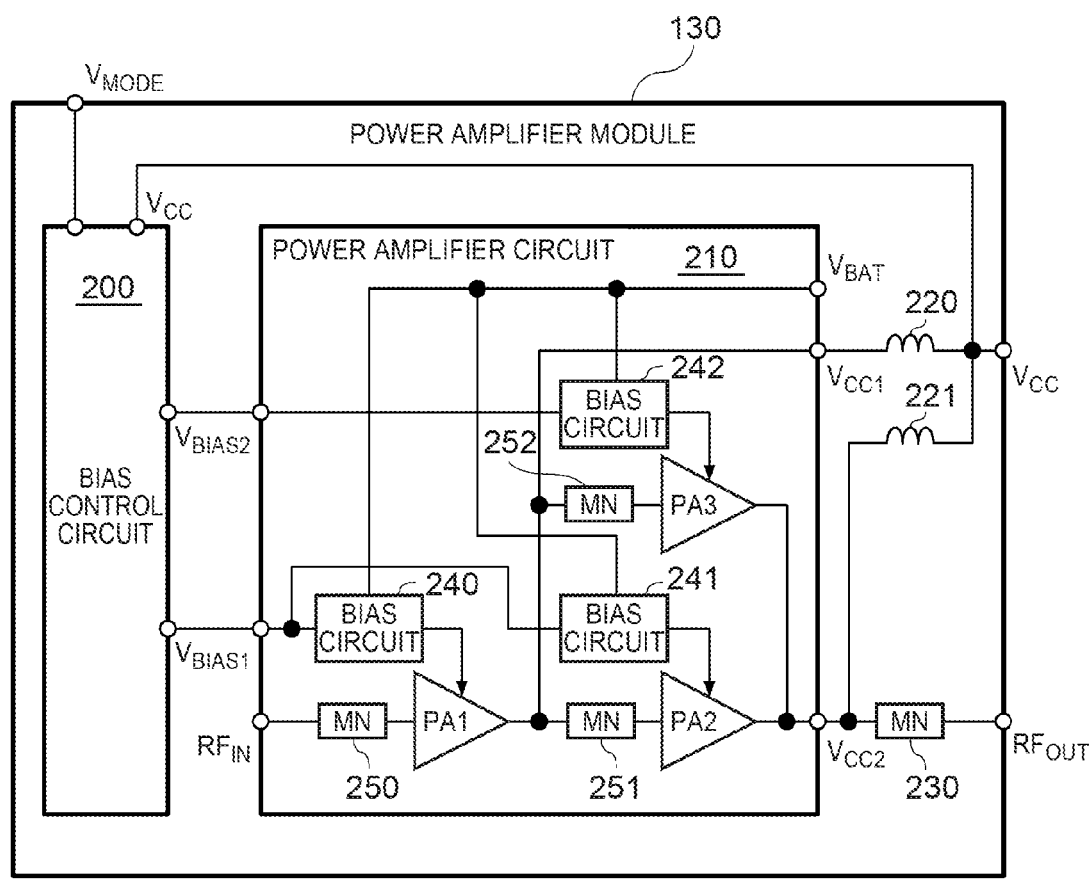
FIG. 2 is a diagram showing an example of a configuration of a power amplifier module.

FIG. 2 is a diagram showing an example of the configuration of the power amplifier module 130. The power amplifier module 130 includes a bias control circuit 200, a power amplifier circuit 210, inductors 220 and 221, and a matching circuit (MN) 230.

The bias control circuit 200 generates bias voltages ($V_{BIAS1}$, $V_{BIAS2}$) according to the level of power supply voltage $V_{CC}$ supplied to the power amplifier module 130. Further, the bias control circuit 200 controls the output of bias voltage based on the power mode control voltage $V_{MODE}$. Specifically, for example, the bias control circuit 200 sets the bias voltage $V_{BIAS2}$ to a zero level in the low power mode. The details of the bias control circuit 200 will be described later.

The power amplifier circuit 210 includes power amplification transistors PA1, PA2, and PA3, bias circuits 240 to 242, and matching circuits (MN) 250 to 252. The power amplifier circuit 210 is, for example, composed of heterojunction bipolar transistors (HBT).

The power amplification transistors PA1 to PA3 are NPN transistors for amplifying the power of an RF signal. The power amplification transistor PA1 constitutes a drive stage, and the power amplification transistors PA2 and PA3 constitute a power stage. An RF signal output from the power amplification transistors PA2 and PA3 in the power stage is output as an amplified signal ($RF_{OUT}$) through the matching circuit 230.

The power supply voltage $V_{CC}$ is supplied to the collector of the power amplification transistor PA1 through the inductor 220. Further, a bias current is supplied from the bias circuit 240 to the base of the power amplification transistor PA1. Further, the RF signal is input to the base of the power amplification transistor PA1 through the matching circuit 250. Then, the power amplification transistor PA1 outputs a signal, obtained by amplifying the RF signal, from the collector of power amplification transistor PA1.

The power supply voltage $V_{CC}$ is supplied to the collector of the power amplification transistor PA2 through the inductor 221. Further, the bias current is supplied from the bias circuit 241 to the base of the power amplification transistor PA2. Further, the RF signal output from the power amplification transistor PA1 is input to the base of the power amplification transistor PA2 through the matching circuit 251. Then, the power amplification transistor PA2 outputs a signal, obtained by amplifying the RF signal, from the collector of the power amplification transistor PA2.

The power supply voltage $V_{CC}$ is supplied to the collector of the power amplification transistor PA3 through the inductor 221. Further, the bias current is supplied from the bias circuit 242 to the base of the power amplification transistor PA3. Further, the RF signal output from the power amplification transistor PA1 is input to the base of the power amplification transistor PA3 through the matching circuit 252. Then, the power amplification transistor PA3 outputs a signal, obtained by amplifying the RF signal, from the collector of the power amplification transistor PA3. Note that, since the bias current is not supplied from the bias circuit 242 in the low power mode, the power amplification transistor PA3 does not operate.

The bias circuit 240 generates a bias current according to the bias voltage $V_{BAIS1}$ to supply the bias current to the base of the power amplification transistor PA1. The bias circuit 241 generates a bias current according to the bias voltage $V_{BIAS1}$ to supply the bias current to the base of the power amplification transistor PA2. The bias circuit 242 generates a bias current according to the bias voltage $V_{BIAS2}$ to supply the bias current to the base of the power amplification transistor PA3. Note that, since the bias voltage $V_{BIAS2}$ is the zero level in the low power mode, the bias circuit 242 does not operate. For example, the bias circuits 240 to 242 can be configured by emitter-follower circuits.

Figure 3:
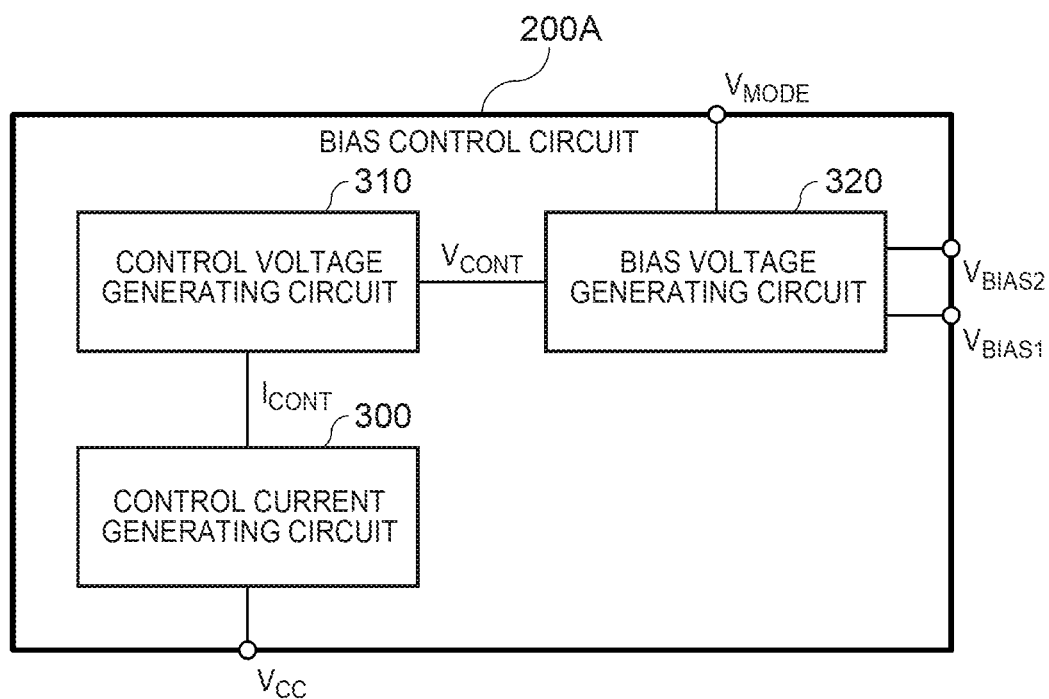
FIG. 3 is a diagram showing an example of a configuration of a bias control circuit.

FIG. 3 is a diagram showing an example of the configuration of the bias control circuit 200A. The bias control circuit 200A includes a control current generating circuit 300, a control voltage generating circuit 310, and a bias voltage generating circuit 320.

The control current generating circuit 300 generates a control current $I_{CONT}$ according to the power supply voltage $V_{CC}$. The control voltage generating circuit 310 generates a control voltage $V_{CONT}$ according to the power supply voltage $V_{CC}$ based on the control current $I_{CONT}$. The bias voltage generating circuit 320 generates bias voltages $V_{BIAS1}$ and $V_{BIAS2}$ according to the power supply voltage $V_{CC}$ based on the power mode control voltage $V_{MODE}$ and the control voltage $V_{CONT}$. The details of each circuit will be described below.

Figure 4:
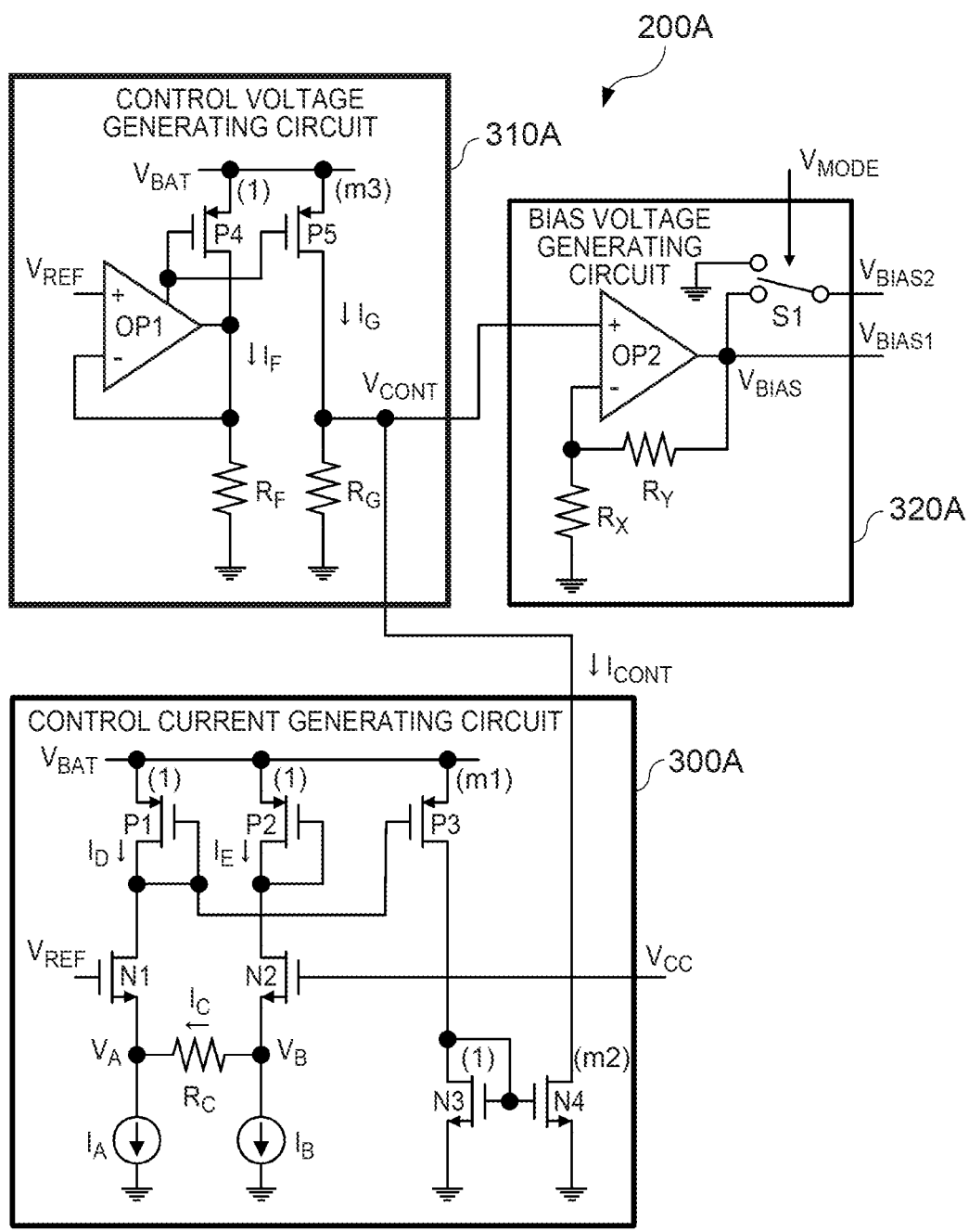
FIG. 4 is a diagram showing an example of a configuration of a control current generating circuit, a control voltage generating circuit, and a bias voltage generating circuit in the bias control circuit.

FIG. 4 is a diagram showing an example of the configuration of the control current generating circuit 300A, the control voltage generating circuit 310A, and the bias voltage generating circuit 320A in the bias control circuit 200A.

The control current generating circuit 300A includes P-channel FETs (P1 to P3), N-channel FETs (N1 to N4), a constant current source $I_A$ (first constant current source), a constant current source $I_B$ (second constant current source), and a resistor $R_C$ (first resistor).

The gate of the N-channel FET (N1) (first N-channel FET) is supplied with a reference voltage $V_{REF}$ (first reference voltage), the drain is connected to the drain of the P-channel FET (P1), and the source is connected to the constant current source $I_A$. The reference voltage $V_{REF}$ is, for example, a band-gap voltage generated based on the battery voltage. The gate of the N-channel FET (N2) (second N-channel FET) is supplied with the power supply voltage $V_{CC}$, the drain is connected to the drain of the P-channel FET (P2), and the source is connected to the constant current source $I_B$. The resistor $R_C$ is provided between the source of the N-channel FET (N1) and the source of the N-channel FET (N2). The N-channel FETs (N1, N2) are the same size, for example.

The P-channel FET (P1) is diode-connected. The P-channel FET (P2) is also diode-connected. The P-channel FET (P3) is current-mirror connected to the P-channel FET (P1). The size ratio of the P-channel FETs (P1 to P3) is, for example, 1:1:m1.

The N-channel FET (N3) is diode-connected with the drain connected to the drain of the P-channel FET (P3). The N-channel FET (N4) is current-mirror connected to the N-channel FET (N3) to output the control current $I_{CONT}$ from the drain of the N-channel FET (N4). The size ratio of the N-channel FETs (N3, N4) is, for example, 1:m2.

Here, the currents of the constant current sources $I_A$ and $I_B$ are denoted as $I_A$ and $I_B$, respectively. Current flowing from the source of the N-channel FET (N2) into the source of the N-channel FET (N1) through the resistor $R_C$ is denoted as $I_C$. Currents flowing through the P-channel FETs (P1, P2) are denoted as $I_D$ and $I_E$, respectively. The resistance value of the resistor $R_C$ is denoted as $R_C$. The source voltages of the N-channel FETs (N1, N2) are denoted as $V_A$ and $V_B$, respectively. Under this condition, the current flowing through the N-channel FET (N4), i.e., the control current $I_{CONT}$ will be described.

First, $I_A+I_B=I_D+I_E$ is established in the control current generating circuit 300A. Further, $I_A=I_D+I_C$ and $I_B=I_E-I_C$ are established. Then, $I_{CONT}=m1 \times m2 \times I_D$ is established. Note that the current $I_D$ is current (differential current) corresponding to a difference between $V_{REF}$ (first reference voltage) and the power supply voltage $V_{CC}$.

When $V_{CC}=V_{REF}$, $I_D=I_E$ because $V_A=V_B$, $I_C (=(V_B-V_A)/R_C)$ becomes zero.

When $V_{CC}>V_{REF}$, $V_B>V_A$, and $I_C$ becomes positive. Since $I_A$ is a constant current, $I_D$ decreases compared to the case when $V_{CC}=V_{REF}$. Therefore, $I_{CONT}$ decreases as $V_{CC}$ rises. Note that the minimum value of $I_D$ is zero. In other words, the minimum value of $I_{CONT}$ is zero.

When $V_{CC}<V_{REF}$, $V_B<V_A$, and $I_C$ becomes negative. Since $I_A$ is a constant current, $I_D$ increases compared to the case when $V_{CC}=V_{REF}$. Therefore, $I_{CONT}$ increases as $V_{CC}$ drops. Note that maximum value of $I_D$ is $I_D=I_A+I_B$. In other words, the maximum value of $I_{CONT}$ is $I_{CONT}=m1 \times m2 \times (I_A+I_B)$.

Thus, the control current generating circuit 300A generates the control current $I_{CONT}$ varying according to the power supply voltage $V_{CC}$. Note that $I_C$ that affects the variation of the control current $I_{CONT}$ by $I_C=(V_B-V_A)/R_C$. Therefore, the rate of change of the control current $I_{CONT}$ according to the change in the power supply voltage $V_{CC}$ varies with the value of $R_C$. Thus, the dynamic range (a $V_{CC}$ range where $I_{CONT}$ varies) of the control current generating circuit 300A can be controlled by the value of $R_C$. Specifically, when the value of $R_C$ is relatively small, the rate of change of $I_{CONT}$ according to $V_{CC}$ increases and the dynamic range becomes smaller. On the other hand, when the value of $R_C$ is relatively large, the rate of change of $I_{CONT}$ according to $V_{CC}$ decreases and the dynamic range becomes larger.

The control voltage generating circuit 310A includes an operational amplifier OP1, P-channel FETs (P4, P5), and resistors $R_F$, $R_G$.

The operational amplifier OP1 is such that the reference voltage $V_{REF}$ is applied to a non-inverting input terminal and an inverting input terminal is connected to an output terminal and one end of the resistor $R_F$. The other end of the resistor $R_F$ is grounded. The drain of the P-channel FET (P4) is connected to the output terminal of the operational amplifier OP1. The P-channel FET (P5) is current-mirror connected to the P-channel FET (P4), and the drain of the P-channel FET (P5) is connected to one end of the resistor $R_G$ (current-voltage conversion circuit). The size ratio of the P-channel FETs (P4, P5) is, for example, 1:m3. The output of the control current generating circuit 300A is also connected to one end of the resistor $R_G$.

Here, the resistance values of the resistors $R_F$, $R_G$ are denoted as $R_F$ and $R_G$, respectively. Currents flowing through the P-channel FETs (P4, P5) are denoted as $I_F$ and $I_G$, respectively. Under this condition, the control voltage $V_{CONT}$ supplied to the bias voltage generating circuit 320A will be described.

The voltage applied to one end of the resistor $R_F$ through a virtual short-circuit of the operational amplifier OP1 becomes $V_{REF}$. Therefore, $I_F$ is $I_F=V_{REF}/R_F$, and $I_G=m3 \times I_F$. As a result, the voltage at one end of the resistor $R_G$, i.e., $V_{CONT}$ becomes $V_{CONT}=(I_G-I_{CONT}) \times R_G$.

Thus, the control voltage generating circuit 310A generates the control voltage $V_{CONT}$ based on the reference current $I_G$ according to the reference voltage $V_{REF}$ and the control current $I_{CONT}$. Note that, since the control current $I_{CONT}$ is current according to the power supply voltage $V_{CC}$, the control voltage $V_{CONT}$ becomes voltage according to the power supply voltage $V_{CC}$.

The bias voltage generating circuit 320A includes an operational amplifier OP2, resistors $R_X$, $R_Y$, and a switch S1.

The control voltage $V_{CONT}$ is applied to a non-inverting input terminal of the operational amplifier OP2. The operational amplifier OP2 and the resistors $R_X$, $R_Y$ constitute a non-inverting amplifier circuit. In other words, a bias voltage $V_{BIAS}$ obtained by amplifying the control voltage $V_{CONT}$ is output from an output terminal of the operational amplifier OP2. An output terminal of the operational amplifier OP2 is connected to an output terminal of the bias voltage $V_{BIAS1}$ and one end of the switch S1.

The switch S1 outputs the bias voltage $V_{BIAS}$ or a zero level of voltage as the bias voltage $V_{BIAS2}$ based on the power mode control voltage $V_{MODE}$. Specifically, in the low power mode, the switch S1 is connected to the ground to output the zero level of voltage as the bias voltage $V_{BIAS2}$. On the other hand, in the high power mode, the switch S1 is connected to the output terminal of the operational amplifier OP2 to output the bias voltage $V_{BIAS}$ as the bias voltage $V_{BIAS2}$.

Thus, the bias voltage generating circuit 320A generates the bias voltages $V_{BIAS1}$ and $V_{BIAS2}$ based on the power mode control voltage $V_{MODE}$ and the control voltage $V_{CONT}$. Note that, since the control voltage $V_{CONT}$ is voltage according to the power supply voltage $V_{CC}$, the bias voltages $V_{BIAS1}$ and $V_{BIAS2}$ are also voltages according to the power supply voltage $V_{CC}$. As a result, bias currents generated in the bias circuits 240 to 242 based on the bias voltages $V_{BIAS1}$ and $V_{BIAS2}$ become currents according to the power supply voltage $V_{CC}$. Accordingly, the bias current is reduced according to a reduction in output power in the power amplifier module 130 where the power supply voltage $V_{CC}$ supplied to the power amplification transistors PA1 to PA3 is controlled according to the level of output power. Thus, since the idle current (current flowing through the power amplification transistors PA1 to PA3 when no RF signal is input) is reduced according to the reduction in output power in the power amplifier module 130, the consumption current can be reduced.

Figure 5:
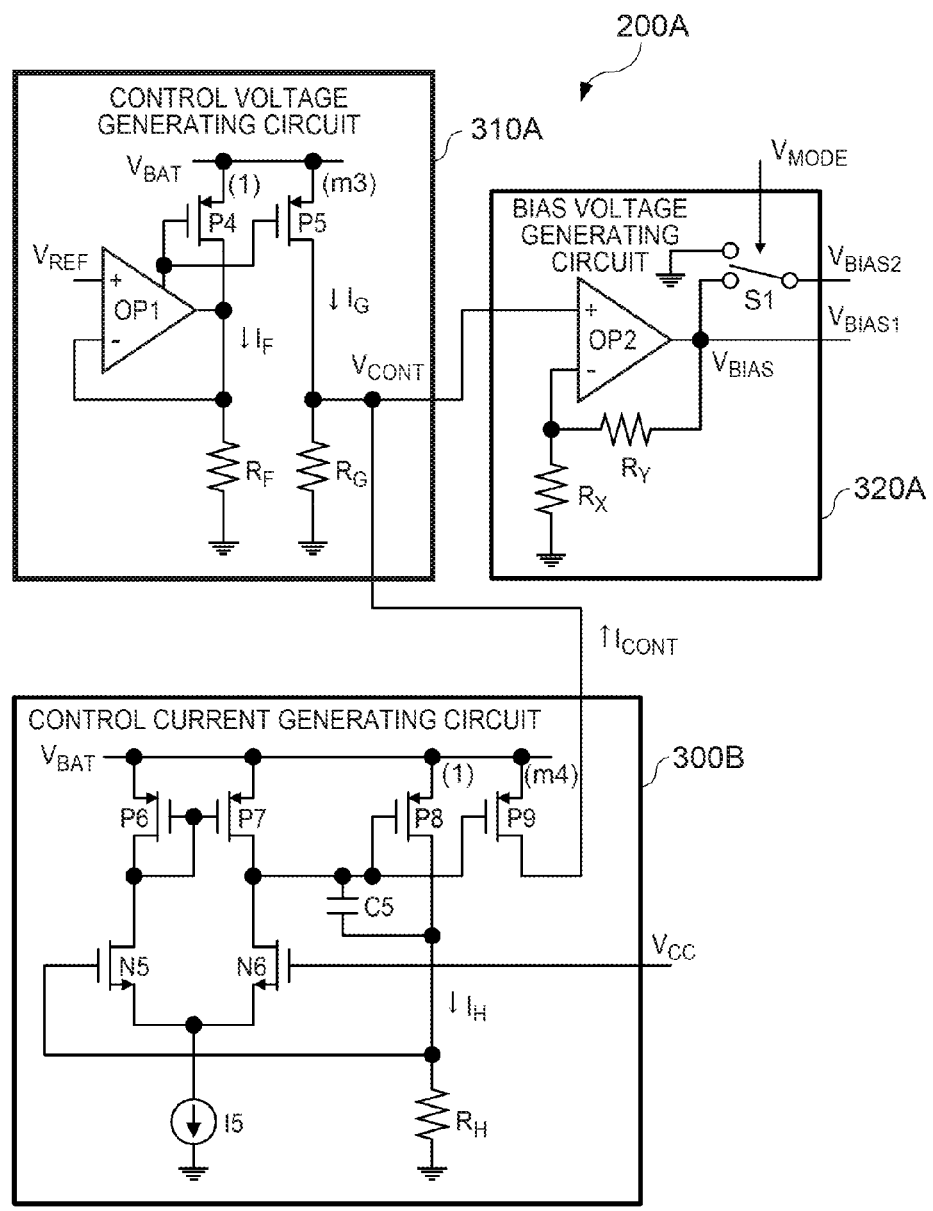
FIG. 5 is a diagram showing another example of a configuration of a control current generating circuit, a control voltage generating circuit, and a bias voltage generating circuit in a bias control circuit.

FIG. 5 is a diagram showing another example of the configuration of the control current generating circuit 300B, the control voltage generating circuit 310A, and the bias voltage generating circuit 320A in the bias control circuit 200A. Since the configuration of the control voltage generating circuit 310A and the bias voltage generating circuit 320A shown in FIG. 5 is the same as that shown in FIG. 4, the description thereof will be omitted.

The control current generating circuit 300B shown in FIG. 5 includes P-channel FETs (P6 to P9), N-channel FETs (N5, N6), a current source I5, a phase-compensation capacitor C5, and a resistor $R_H$ (second resistor).

The P-channel FET (P6) (first P-channel FET) is diode-connected. The P-channel FET (P7) (second P-channel FET) is current-mirror connected to the P-channel FET (P6). The gate of the P-channel FET (P8) is connected to the drain of the P-channel FET (P7), and the drain of the P-channel FET (P8) is connected to one end of the resistor $R_H$. The P-channel FET (P9) is current-mirror connected to the P-channel FET (P8) to output the control current $I_{CONT}$ from the drain of the P-channel FET (P9). The size ratio of the P-channel FETs (P8, P9) is, for example, 1:m4.

The N-channel FET (N5) (third N-channel FET) is such that the gate is connected to one end of the resistor $R_H$, the drain is connected to the drain of the P-channel FET (P6), and the source is connected to the current source I5. The N-channel FET (N6) (fourth N-channel FET) is such that the power supply voltage $V_{CC}$ is applied to the gate, the drain is connected to the drain of the P-channel FET (P7), and the source is connected to the current source I5.

Here, the current flowing through the P-channel FET (P9), i.e., the control current $I_{CONT}$ will be described, where the resistance value of the resistor $R_H$ is denoted as $R_H$ and the current flowing through the P-channel FET (P8) is denoted as $I_H$.

The P-channel FETs (P6, P7), the N-channel FETs (N5, N6), and the current source I5 form a circuit constituting an operational amplifier. The voltage at one end of the resistor $R_H$ becomes the power supply voltage $V_{CC}$ through a virtual short-circuit of this operational amplifier. Therefore, the current $I_H$ flowing through the P-channel FET (P8) is $I_H = V_{CC}/R_H$. As a result, the control current $I_{CONT}$ is $I_{CONT} = m4 \times V_{CC}/R_H$.

Thus, the control current generating circuit 300B shown in FIG. 5 generates the control current $I_{CONT}$ varying according to the power supply voltage $V_{CC}$. Note that the rate of change of the control current $I_{CONT}$ varies with the value of $R_H$.

In the configuration shown in FIG. 4, the control voltage $V_{CONT}$ is controlled by subtracting the control current $I_{CONT}$ from the reference current $I_G$, whereas in the configuration shown in FIG. 5, the control voltage $V_{CONT}$ is controlled by adding the control current $I_{CONT}$ to the reference current $I_G$. In other words, $V_{CONT} = (I_G + I_{CONT}) \times R_G$. In the configuration shown in FIG. 5, $I_{CONT} = m4 \times V_{CC}/R_H$, resulting in reducing the control current $I_{CONT}$ with a drop in power supply voltage $V_{CC}$. Therefore, the control voltage $V_{CONT}$ is reduced according to the drop in the power supply voltage $V_{CC}$. As a result, since the idle current is reduced according to the reduction in output power in the power amplifier module 130, the consumption current can be reduced.

Figure 6:
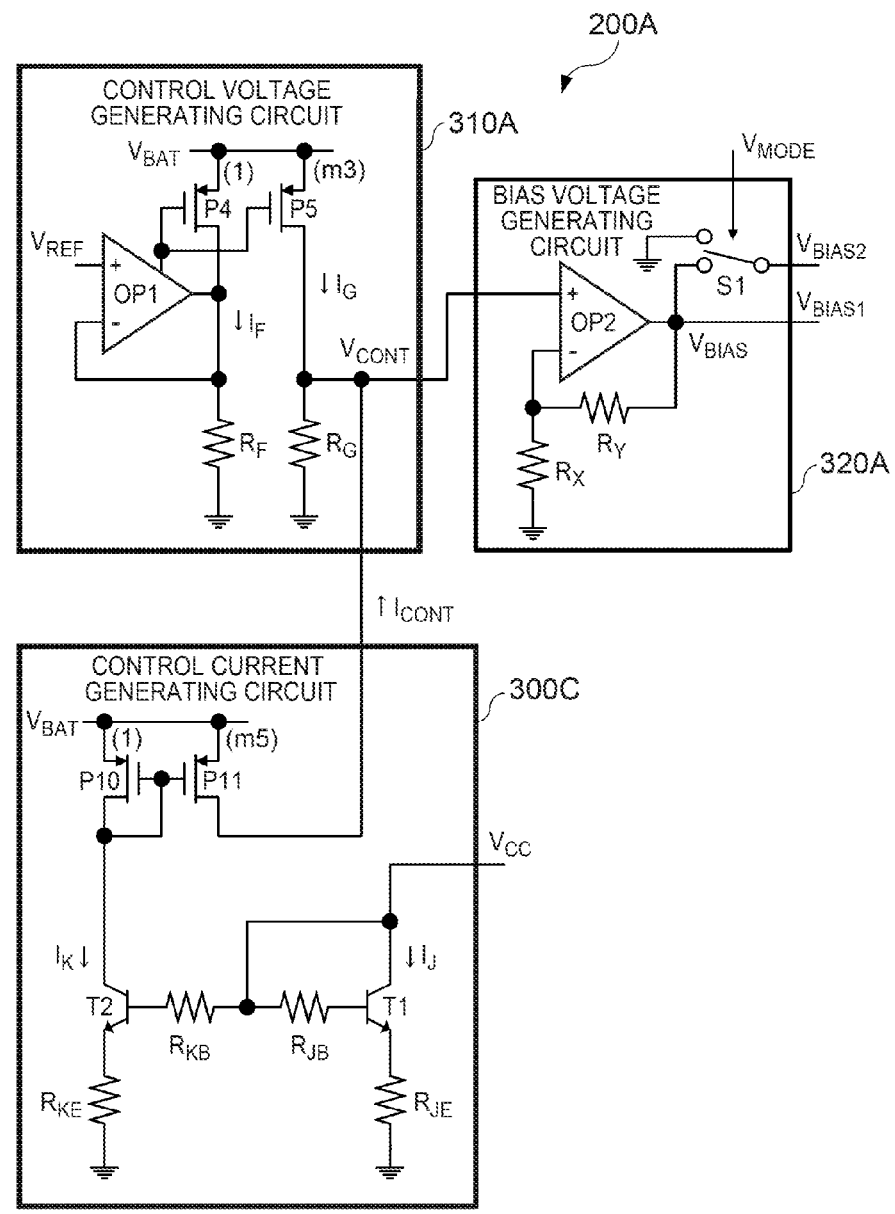
FIG. 6 is a diagram showing still another example of a configuration of a control current generating circuit, a control voltage generating circuit, and a bias voltage generating circuit in a bias control circuit.

FIG. 6 is a diagram showing still another example of the configuration of the control current generating circuit 300C, the control voltage generating circuit 310A, and the bias voltage generating circuit 320A in the bias control circuit 200A. Note that, since the configuration of the control voltage generating circuit 310A and the bias voltage generating circuit 320A shown in FIG. 6 is the same as that in FIG. 4, the description thereof will be omitted.

The control current generating circuit 300C shown in FIG. 6 includes P-channel FETs (P10, P11), NPN transistors T1, T2, and resistors $R_{JB}$, $R_{JE}$, $R_{KB}$, and $R_{KE}$.

The NPN transistor T1 (first NPN transistor) is diode-connected in such a manner that the power supply voltage $V_{CC}$ is applied to the collector and the power supply voltage $V_{CC}$ is applied to the base through the resistor $R_{JB}$. The NPN transistor T2 (second NPN transistor) is current-mirror connected to the NPN transistor T1 through the resistor $R_{KB}$. The NPN transistors T1 and T2 are, for example, of the same size.

The resistor $R_{JB}$ is provided between the base and the collector of the NPN transistor T1, and the resistor $R_{JE}$ (third resistor) is provided between the emitter of the NPN transistor T1 and the ground. The resistor $R_{KB}$ is provided between the base of the NPN transistor T2 and the collector of the NPN transistor T1, and the resistor R (fourth resistor) is provided between the emitter of the NPN transistor T2 and the ground. For example, the resistors $R_{JB}$ and $R_{KB}$ have the same resistance value. Further, for example, the resistors $R_{JE}$ and $R_{KE}$ have the same resistance value.

The P-channel FET (P10) is diode-connected with the drain connected to the collector of the NPN transistor T2. The P-channel FET (P11) is current-mirror connected to the P-channel FET (P10) to output the control current $I_{CONT}$ from the drain of the P-channel FET (P11). The size ratio of the P-channel FETs (P10, P11) is, for example, 1:m5.

Here, the current flowing through P-channel FET (P11), i.e., the control current $I_{CONT}$ will be described, where the resistance value of the resistor $R_J$ is denoted as $R_{JE}$, the base-emitter voltage of the NPN transistor T1 is denoted as $V_{BE}$, and the collector currents of the NPN transistors T1 and T2 are denoted as $I_J$ and $I_K$, respectively.

When the base current of the NPN transistor T1 is ignored for ease of description, $I_J = (V_{CC} - V_{BE})/R_{JE}$, where $I_K = I_J$. Therefore, $I_{CONT} = m5 \times (V_{CC} - V_{BE})/R_{JE}$.

Thus, the control current generating circuit 300C shown in FIG. 6 generates the control current $I_{CONT}$ varying according to the power supply voltage $V_{CC}$. In the configuration shown in FIG. 6, the control voltage $V_{CONT}$ is controlled by adding the control current $I_{CONT}$ to the reference current $I_G$ like in the configuration shown in FIG. 5. In other words, $V_{CONT} = (I_G + I_{CONT}) \times R_G$. In the configuration shown in FIG. 6, $I_{CONT} = m5 \times (V_{CC} - V_{BE})/R_{JE}$, resulting in reducing the control current $I_{CONT}$ with a drop in power supply voltage $V_{CC}$. Therefore, the control voltage $V_{CONT}$ is reduced according to the drop in the power supply voltage $V_{CC}$. As a result, since the idle current is reduced according to the reduction in output power in the power amplifier module 130, the consumption current can be reduced.

Figure 7:
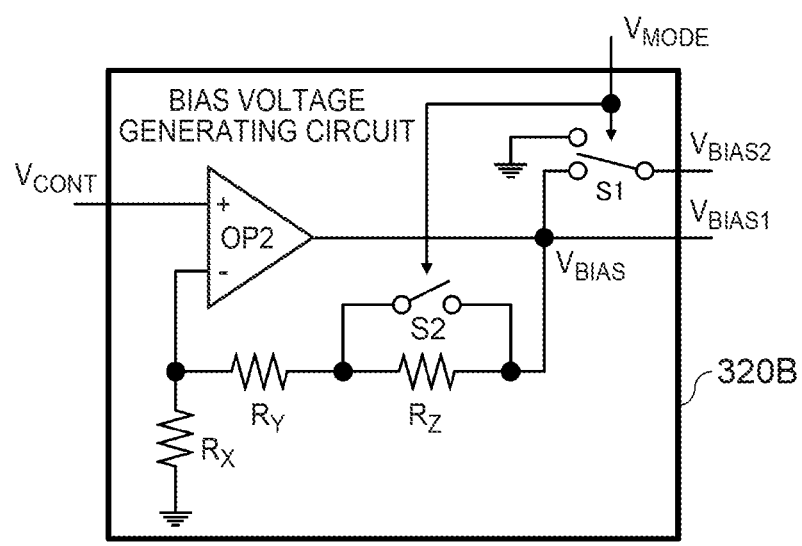
FIG. 7 is a diagram showing another example of a configuration of a bias voltage generating circuit.

FIG. 7 is a diagram showing another example of the configuration of the bias voltage generating circuit 320B. The bias voltage generating circuit 320B shown in FIG. 7 can be used instead of the bias voltage generating circuit 320A shown in FIG. 4 to FIG. 6. Note that the same reference numerals are used for the same elements as those in the bias voltage generating circuit 320A shown in FIG. 4 to FIG. 6 to omit redundant description.

In addition to the configuration of the bias voltage generating circuit 320A shown in FIG. 4 to FIG. 6, the bias voltage generating circuit 320B shown in FIG. 7 includes a resistor $R_Z$ and a switch S2.

The resistors $R_Y$ and $R_Z$ are connected in series and provided between the inverting input terminal and the output terminal of the operational amplifier OP2. The switch S2 is provided between both ends of the resistor $R_Z$ to operate based on the power mode control voltage $V_{MODE}$. Specifically, the switch S2 is on in the low power mode or off in the high power mode. Therefore, the bias voltage $V_{BIAS}$ generated by the bias voltage generating circuit 320B is low in the low power mode. This can further reduce the consumption current at the time of low power.

Figure 8:
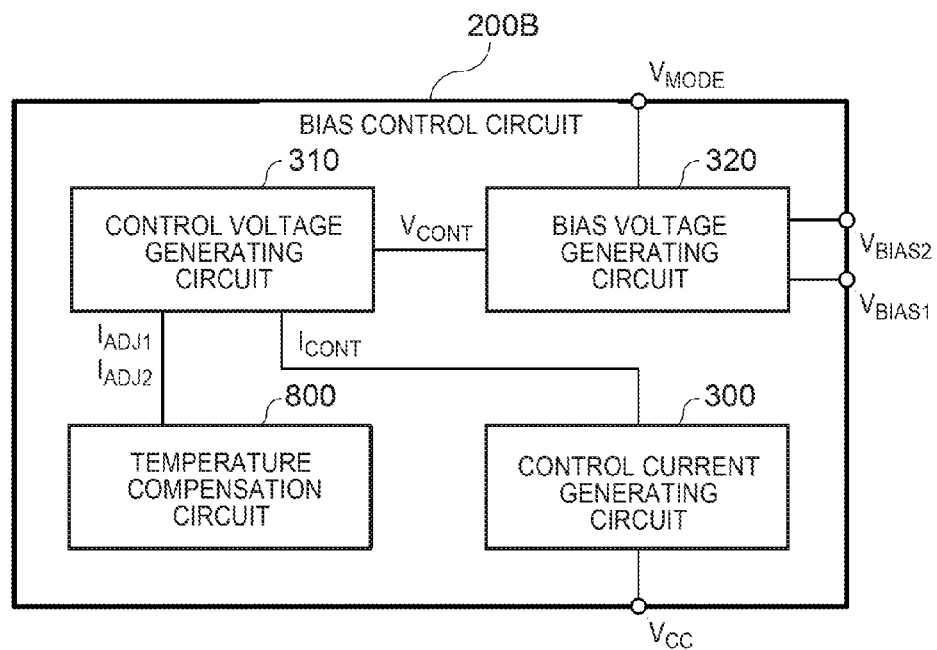
FIG. 8 is a diagram showing another example of a configuration of a bias control circuit.

FIG. 8 is a diagram showing another example of the configuration of a bias control circuit 200B. The bias control circuit 200B shown in FIG. 8 includes a temperature compensation circuit 800 in addition to the configuration of bias control circuit 200A shown in FIG. 3. The temperature compensation circuit 800 generates adjustment currents $I_{ADJ1}$ and $I_{ADJ2}$ for adjusting the bias current according to the temperature characteristics of the amplification transistors PA1 to PA3 of the power amplifier circuit 210.

Figure 9:
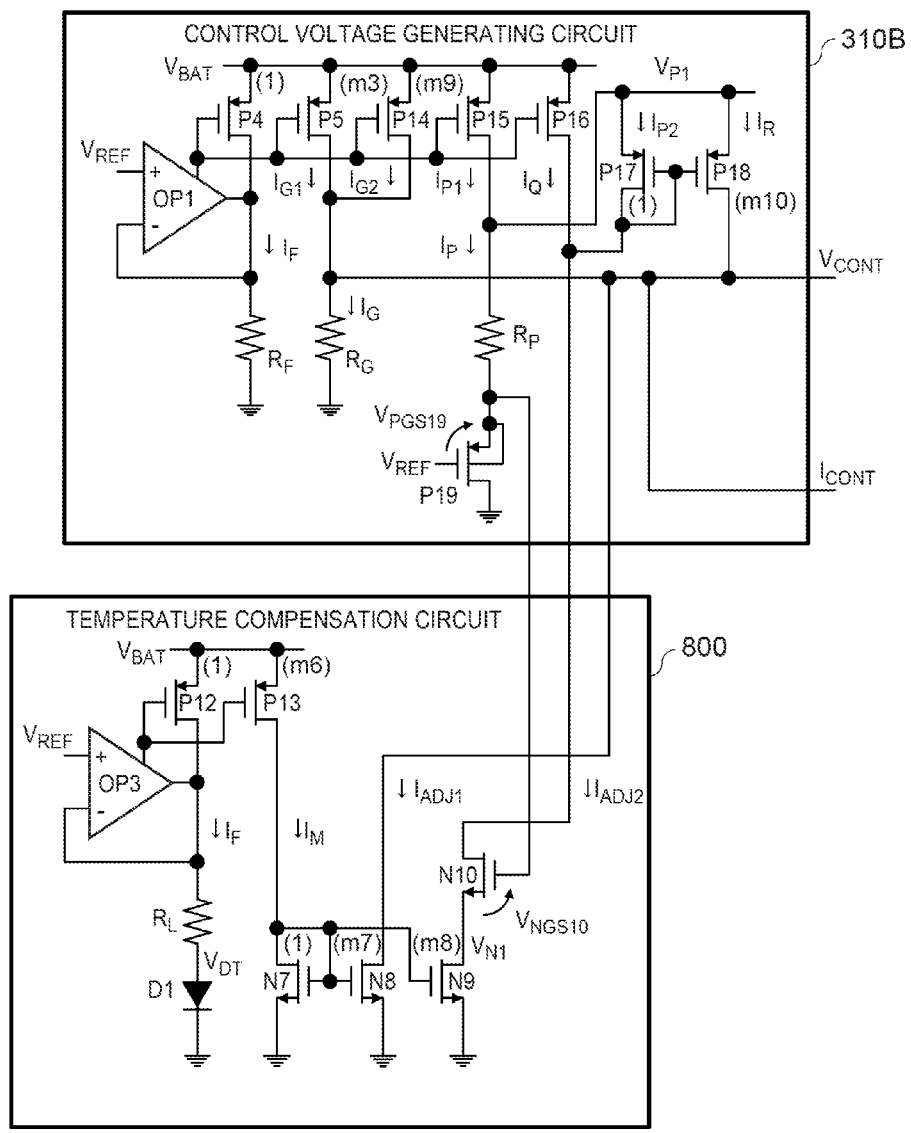
FIG. 9 is a diagram showing an example of a configuration of a temperature compensation circuit and a control voltage generating circuit in the bias control circuit shown in FIG. 8.

FIG. 9 is a diagram showing an example of the configuration of the temperature compensation circuit 800 and the control voltage generating circuit 310B in the bias control circuit 200B shown in FIG. 8. Note that any of the configurations shown in FIG. 4 to FIG. 7 can be adopted for the control current generating circuit 300 and the bias voltage generating circuit 320.

The temperature compensation circuit 800 includes an operational amplifier OP3, P-channel FETs (P12, P13), N-channel FETs (N7 to N10), a resistor $R_L$, and a diode D1.

The operational amplifier OP3 is such that the reference voltage $V_{REF}$ is applied to a non-inverting input terminal and an inverting input terminal is connected to an output terminal and one end of the resistor $R_L$. The other end of the resistor $R_L$ is connected to the anode of the diode D1, and the cathode of the diode D1 is grounded.

The drain of the P-channel FET (P12) is connected to the output terminal of the operational amplifier OP3. The P-channel FET (P13) is current-mirror connected to the P-channel FET (P12), and the drain of the P-channel FET (P13) is connected to the drain of the N-channel FET (N7). The size ratio of the P-channel FETs (P12, P13) is, for example, 1:m6.

The N-channel FET (N7) is diode-connected, and the drain of the N-channel FET (N7) is connected to the drain of the P-channel FET (P13). The N-channel FET (N8) is current-mirror connected to the N-channel FET (N7) to output the adjustment current $I_{ADJ1}$ from the drain of the N-channel FET (N8). The N-channel FET (N9) is current-mirror connected to the N-channel FET (N7), and the drain of the N-channel FET (N9) is connected to the source of the N-channel FET (N10). The gate of the N-channel FET (N10) is connected to the source of the P-channel FET (P19) of the control voltage generating circuit 310B to output the adjustment current $I_{ADJ2}$ from the drain of the N-channel FET (N10). The size ratio of the N-channel FETs (N7, N8, N9) is, for example, 1:m7:m8.

Here, the resistance value of the resistor $R_L$ is denoted as $R_L$, a forward-drop voltage across the diode D1 is denoted as $V_{DT}$, and currents flowing through the P-channel FETs (P12, P13) are denoted as $I_L$ and $I_M$, respectively. Under this condition, the adjustment currents $I_{ADJ1}$ and $I_{ADJ2}$ will be described.

The voltage at one end of the resistor $R_L$ becomes $V_{REF}$ through a virtual short-circuit of the operational amplifier OP3. Further, the voltage at the other end of the resistor $R_L$ becomes $V_{DT}$. Therefore, $I_L=(V_{REF}-V_{DT})/R_L$, and $I_M=m6\times I_L$. As a result, $I_{ADJ1}=m6\times m7\times I_L$ and $I_{ADJ2}=m6\times m8\times I_L$. Note that the forward-drop voltage $V_{DT}$ varies according to the temperature characteristics of the diode D1. Specifically, for example, $V_{DT}$ has such characteristics that it rises at low temperature and drops at high temperature. Thus, $I_{ADJ1}$ and $I_{ADJ2}$ vary according to the temperature characteristics of the diode D1.

The control voltage generating circuit 310B shown in FIG. 9 includes P-channel FETs (P14 to P19) and a resistor $R_P$ in addition to the configuration shown in FIG. 4. Note that the same reference numerals are used for the same elements as those in the control voltage generating circuit 310A shown in FIG. 4 to omit redundant description.

The P-channel FETs (P14, P15, P16) are current-mirror connected to the P-channel FET (P4). The P-channel FET (P17) is diode-connected with the source connected to the drain of the P-channel FET (P15) and the drain connected to the drain of the P-channel FET (P16). The P-channel FET (P18) is current-mirror connected to the P-channel FET (P17) with the drain connected to one end of the resistor $R_G$. The P-channel FET (P19) is such that the reference voltage $V_{REF}$ is applied to the gate, the source and the back gate are connected to the other end of the resistor $R_P$, and the drain is grounded. The size ratio of the P-channel FETs (P4, P5, P14) is, for example, 1:m3:m9. Further, the size ratio of the P-channel FETs (P17, P18) is, for example, 1:m10.

Here, the resistance values of the resistors $R_F$, $R_G$, and $R_P$ are denoted as $R_F$, $R_G$, and $R_P$, respectively. Currents flowing through the P-channel FETs (P4, P5, P14 to P18) are denoted as $I_F$, $I_{G1}$, $I_{G2}$, $I_{P1}$, $I_Q$, $I_{P2}$, and $I_R$, respectively. Further, current flowing through the resistor $R_G$ is denoted as $I_G$. Under this condition, the control voltage $V_{CONT}$ supplied to the bias voltage generating circuit 320 will be described.

The voltage applied to one end of the resistor $R_F$ through a virtual short-circuit of the operational amplifier OP1 becomes $V_{REF}$. Therefore, $I_F$ is $I_F=V_{REF}/R_F$. Further, $I_{G1}=m3\times I_F$ and $I_{G2}=m9\times I_F$. Further, $I_{P2}=I_{ADJ2}-I_Q$. As a result, $I_R=m10\times I_{P2}=m10\times(I_{ADJ2}-I_Q)$.

When the control current generating circuit 300 has the configuration shown in FIG. 4, $I_G=I_{G1}+I_{G2}+I_R-I_{ADJ1}-I_{CONT}=I_{G1}-I_{CONT}+(I_{G2}-I_{ADJ1})+m10\times(I_{ADJ2}-I_Q)$. Then, the control voltage $V_{CONT}=I_G\times R_G$. When the control current generating circuit 300 has the configuration shown in FIG. 5 or FIG. 6, $I_G=I_{G1}+I_{G2}+I_R-I_{ADJ1}+I_{CONT}$. The following description will be made assuming that the control current generating circuit 300 has the configuration shown in FIG. 4.

The temperature compensation circuit 800 and the control voltage generating circuit 310B are designed so that $I_{G2}=I_{ADJ1}$ and $I_Q=I_{ADJ2}$ at a predetermined temperature T. In other words, $I_G=I_{G1}-I_{CONT}$ at the temperature T.

When the temperature is lower than T, since $I_Q>I_{ADJ2}$, $I_R$ becomes zero. Therefore, $I_G=I_{G1}-I_{CONT}+(I_{G2}-I_{ADJ1})$. $I_{ADJ1}$ increases as the temperature rises. Thus, in a range where the temperature is lower than T, $I_G$ decreases according to the rate of change of $I_{ADJ1}$ as the temperature rises.

When the temperature is higher than T, since $I_Q<I_{ADJ2}$, $I_R$ becomes positive. Therefore, $I_G=I_{G1}-I_{CONT}+(I_{G2}-I_{ADJ1})+m10\times(I_{ADJ2}-I_Q)$. $I_{ADJ2}$ increases as the temperature rises. Thus, in a range where the temperature is higher than T, $I_G$ decreases according to the rates of change of $I_{ADJ1}$ and $I_{ADJ2}$ as the temperature rises. Note that, since $I_R$ is added to $I_G$ in the range where the temperature is higher than T, the rate of decrease in $I_G$ with a rise in temperature becomes lower than that in the range where the temperature is lower than T.

Thus, the temperature compensation circuit 800 generates the adjustment currents $I_{ADJ1}$ and $I_{ADJ2}$ varying according to the temperature characteristics of the amplification transistors PA1 to PA3. This leads to the adjustment of the bias voltages $V_{BIAS1}$ and $V_{BIAS2}$ supplied to the power amplifier circuit 210 according to the temperature characteristics of the amplification transistors PA1 to PA3.

Further, in the configuration shown in FIG. 9, if the source voltage of the P-channel FETs (P17, P18) is denoted as $V_{P1}$ and the gate-source voltage of the P-channel FET (P19) is denoted as $V_{PGS19}$, $V_{P1}=V_{REF}+V_{PGS19}+I_P\times R_P$. Note that $I_P = I_{P1} - (I_{P2} + I_R)$. Further, if the drain voltage of the N-channel FET (N9) is denoted as $V_{N1}$ and the gate-source voltage of the N-channel FET (N10) is denoted as $V_{NGS10}$, $V_{N1} = V_{REF} + V_{PGS19} - V_{NGS10}$.

Thus, in the configuration shown in FIG. 9, the source voltage $V_{P1}$ of the P-channel FETs (P17, P18) and the drain voltage $V_{N1}$ of the N-channel FET (N9) are independent of the variation of the battery voltage $V_{BAT}$. Therefore, the dependence of the control voltage $V_{CONT}$ on the battery voltage $V_{BAT}$ can be reduced.

Figure 10:
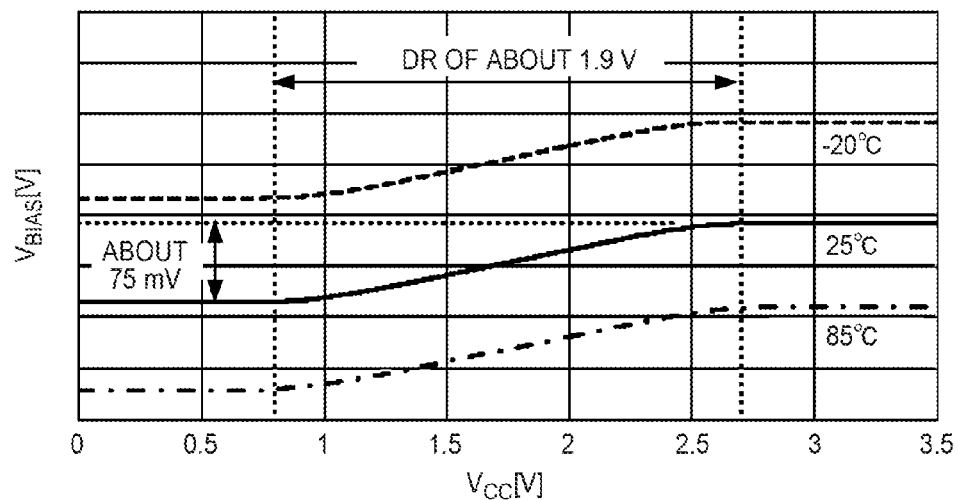
FIG. 10 is a graph showing simulation results in a low power mode in the configuration shown in FIG. 9.
Figure 11:
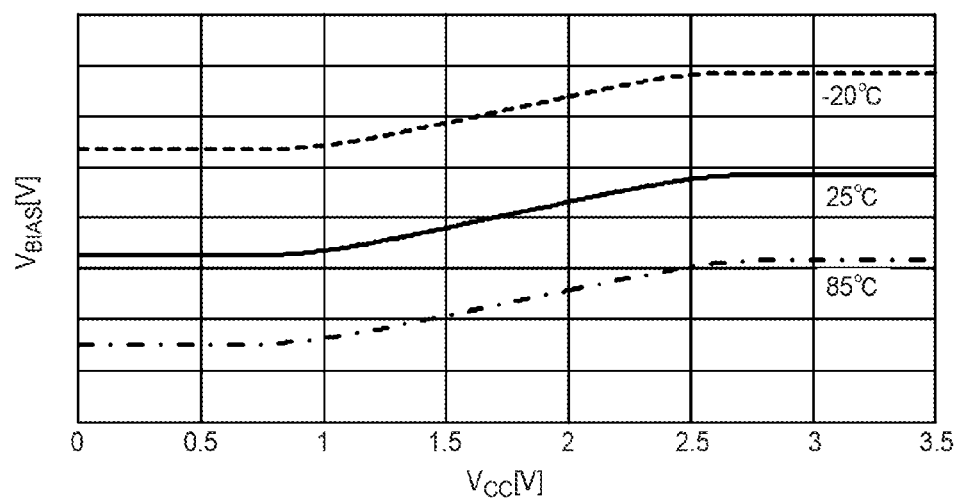
FIG. 11 is a graph showing simulation results in a high power mode in the configuration shown in FIG. 9.

FIG. 10 is a graph showing simulation results in the low power mode in the configuration shown in FIG. 9. FIG. 11 is a graph showing simulation results in the high power mode in the configuration shown in FIG. 9. In FIG. 10 and FIG. 11, the abscissa indicates power supply voltage $V_{CC}$[V] and the ordinate indicates bias voltage $V_{BIAS}$[V].

As shown in FIG. 10, the bias voltage $V_{BIAS}$ decreases with a drop in power supply voltage $V_{CC}$ in a dynamic range of about 1.9 V at any of temperatures 25° C., 85° C., and -20° C. Thus, the consumption current can be reduced during low power. Further, as shown in FIG. 10, the bias voltage $V_{BIAS}$ varies according to the temperature. This can lead to the adjustment of the bias current according to the temperature characteristics of the amplification transistors PA1 to PA3. The same holds true for the high power mode shown in FIG. 11.

The embodiment has been described above. According to the embodiment, the bias voltage $V_{BIAS}$ decreases with a drop in power supply voltage $V_{CC}$ to reduce the bias current. Thus, since the idle current is reduced according to a reduction in output power in the power amplifier module 130 in which the power supply voltage $V_{CC}$ supplied to the power amplification transistors PA1 to PA3 is controlled according to the level of output power, the consumption current can be reduced.

Note that the embodiment is to facilitate the understanding of the present invention, and not to limit the present invention. The present invention can be changed/modified without departing from the scope thereof, and equivalents can also be included in the present invention.

DESCRIPTION OF REFERENCE NUMERALS 100 transmitting unit
110 modulation section
120 power supply control section
130 power amplifier module
140 front-end section
150 antenna
200, 200A, 200B bias control circuit
210 power amplifier circuit
220, 221 inductor
230, 250 to 252 matching circuit
240 to 242 bias circuit
PA1 to PA3 power amplification transistor
300, 300A, 300B, 300C control current generating circuit
310, 310A, 310B control voltage generating circuit
320, 320A, 320B bias voltage generating circuit
800 temperature compensation circuit

What is claimed is:

1. A power amplifier module comprising:
an amplification transistor supplied with a power supply voltage according to a level of output power to amplify a radio-frequency signal;
a bias control circuit for generating a bias voltage according to the power supply voltage, the bias control circuit including:
a temperature compensation circuit for generating an adjustment current varying according to temperature characteristics of the amplification transistor,
whereby the bias voltage according to the power supply voltage is adjusted based on the adjustment current; and
a bias circuit for supplying a bias current according to the bias voltage to the amplification transistor,
wherein a current flowing through the amplification transistor when the radio-frequency signal is not input is varied according to the level of output power.

2. The power amplifier module according to claim 1, wherein the bias control circuit further includes:
a control current generating circuit for generating a control current according to the power supply voltage;
a control voltage generating circuit for generating a control voltage according to the power supply voltage based on the control current; and
a bias voltage generating circuit for generating the bias voltage based on the control voltage.

3. The power amplifier module according to claim 2, wherein the control current generating circuit includes:
a differential current generating circuit for generating a differential current corresponding to a difference between a first reference voltage and the power supply voltage; and
a current mirror circuit for generating the control current as a mirror current of the differential current.

4. The power amplifier module according to claim 3, wherein the differential current generating circuit includes:
a first N-channel FET with a gate supplied with the reference voltage;
a second N-channel FET with a gate supplied with the power supply voltage;
a first constant current source connected to a source of the first N-channel FET;
a second constant current source connected to a source of the second N-channel FET; and
a first resistor provided between the sources of the first and second N-channel FETs,
whereby the differential current is generated based on a current in a drain of the first N-channel FET.

5. The power amplifier module according to claim 2, wherein the control current generating circuit includes:
an operational amplifier with the power supply voltage applied to one input terminal thereof; and
a second resistor with one end connected to another input terminal of the operational amplifier and another end grounded,
whereby the control current is generated based on a voltage applied to the one end of the second resistor.

6. The power amplifier module according to claim 5, wherein the operational amplifier includes:
a first P-channel FET diode-connected;
a second P-channel FET current-mirror connected to the first P-channel FET;
a third N-channel FET with a drain connected to a drain of the first P-channel FET and a gate connected to the one end of the second resistor;
a fourth N-channel FET with a drain connected to a drain of the second P-channel FET and a gate supplied with the power supply voltage; and
a current source connected to sources of the third and fourth N-channel FETs.

7. The power amplifier module according to claim 2, wherein the control current generating circuit includes:

a first NPN transistor with a collector and a base supplied with the power supply voltage;
a third resistor with one end connected to an emitter of the first NPN transistor and another end grounded;
a second NPN transistor with a base supplied with the power supply voltage; and
a fourth resistor with one end connected to an emitter of the second NPN transistor and another end grounded,
whereby the control current is generated based on a current in a collector of the second NPN transistor.

8. The power amplifier module according to claim 2, wherein the control voltage generating circuit includes:
a reference current generating circuit for generating a reference current based on a second reference voltage; and
a current-voltage conversion circuit for converting, to the control voltage, a current obtained by subtracting the control current from the reference current or by adding the control current to the reference current.

9. The power amplifier module according to claim 2, wherein the bias voltage generating circuit includes:
an amplifier circuit for amplifying the control voltage by an amplification factor corresponding to an output mode of the output power to generate the bias voltage.

10. The power amplifier module according to claim 9, wherein the bias voltage generating circuit generates first and second bias voltages, the first bias voltage having a non-zero voltage and the second bias voltage having a zero voltage in a low-power output mode, and the first and second bias voltages both having a non-zero voltage in a high-power output mode.

11. A power amplifier module comprising:
an amplification transistor supplied with a power supply voltage according to a level of output power to amplify a radio-frequency signal;
a bias control circuit for generating a bias voltage according to the power supply voltage, the bias control circuit including:
a control current generating circuit for generating a control current according to the power supply voltage;
a control voltage generating circuit for generating a control voltage according to the power supply voltage based on the control current; and
a bias voltage generating circuit for generating the bias voltage based on the control voltage; and
a bias circuit for supplying a bias current according to the bias voltage to the amplification transistor,
wherein a current flowing through the amplification transistor when the radio-frequency signal is not input is varied according to the level of output power,
wherein the control current generating circuit includes:
a differential current generating circuit for generating a differential current corresponding to a difference between a first reference voltage and the power supply voltage; and
a current mirror circuit for generating the control current as a mirror current of the differential current.

12. The power amplifier module according to claim 11, wherein the control current generating circuit includes:
an operational amplifier with the power supply voltage applied to one input terminal thereof; and
a second resistor with one end connected to another input terminal of the operational amplifier and another end grounded,
whereby the control current is generated based on a voltage applied to the one end of the second resistor.

13. The power amplifier module according to claim 11, wherein the control current generating circuit includes:
a first NPN transistor with a collector and a base supplied with the power supply voltage;
a third resistor with one end connected to an emitter of the first NPN transistor and another end grounded;
a second NPN transistor with a base supplied with the power supply voltage; and
a fourth resistor with one end connected to an emitter of the second NPN transistor and another end grounded,
whereby the control current is generated based on a current in a collector of the second NPN transistor.

14. The power amplifier module according to claim 11, wherein the differential current generating circuit includes:
a first N-channel FET with a gate supplied with the reference voltage;
a second N-channel FET with a gate supplied with the power supply voltage;
a first constant current source connected to a source of the first N-channel FET;
a second constant current source connected to a source of the second N-channel FET; and
a first resistor provided between the sources of the first and second N-channel FETs,
whereby the differential current is generated based on a current in a drain of the first N-channel FET.

15. The power amplifier module according to claim 12, wherein the operational amplifier includes:
a first P-channel FET diode-connected;
a second P-channel FET current-mirror connected to the first P-channel FET;
a third N-channel FET with a drain connected to a drain of the first P-channel FET and a gate connected to the one end of the second resistor;
a fourth N-channel FET with a drain connected to a drain of the second P-channel FET and a gate supplied with the power supply voltage; and
a current source connected to sources of the third and fourth N-channel FETs.

16. The power amplifier module according to claim 11, wherein the control voltage generating circuit includes:
a reference current generating circuit for generating a reference current based on a second reference voltage; and
a current-voltage conversion circuit for converting, to the control voltage, a current obtained by subtracting the control current from the reference current or by adding the control current to the reference current.

17. The power amplifier module according to claim 11, wherein the bias voltage generating circuit includes:
an amplifier circuit for amplifying the control voltage by an amplification factor corresponding to an output mode of the output power to generate the bias voltage.

18. The power amplifier module according to claim 17, wherein the bias voltage generating circuit generates first and second bias voltages, the first bias voltage having a non-zero voltage and the second bias voltage having a zero voltage in a low-power output mode, and the first and second bias voltages both having a non-zero voltage in a high-power output mode.

19. A power amplifier module comprising:
an amplification transistor supplied with a power supply voltage according to a level of output power to amplify a radio-frequency signal;
a bias control circuit for generating a bias voltage according to the power supply voltage, the bias control circuit including:

a control current generating circuit for generating a control current according to the power supply voltage, the control current generating circuit including:
  a first NPN transistor with a collector and a base supplied with the power supply voltage;
  a third resistor with one end connected to an emitter of the first NPN transistor and another end grounded;
  a second NPN transistor with a base supplied with the power supply voltage; and
  a fourth resistor with one end connected to an emitter of the second NPN transistor and another end grounded,
  whereby the control current is generated based on a current in a collector of the second NPN transistor;
a control voltage generating circuit for generating a control voltage according to the power supply voltage based on the control current; and
a bias voltage generating circuit for generating the bias voltage based on the control voltage; and
a bias circuit for supplying a bias current according to the bias voltage to the amplification transistor,
wherein a current flowing through the amplification transistor when the radio-frequency signal is not input is varied according to the level of output power.

20. The power amplifier module according to claim 19, wherein the control voltage generating circuit includes:
  a reference current generating circuit for generating a reference current based on a second reference voltage; and
  a current-voltage conversion circuit for converting, to the control voltage, a current obtained by subtracting the control current from the reference current or by adding the control current to the reference current.

21. The power amplifier module according to claim 19, wherein the bias voltage generating circuit includes:
  an amplifier circuit for amplifying the control voltage by an amplification factor corresponding to an output mode of the output power to generate the bias voltage.

* * * * *

UNITED STATES PATENT AND TRADEMARK OFFICE
CERTIFICATE OF CORRECTION

PATENT NO.       : 9,461,594 B2
APPLICATION NO.  : 14/589376
DATED            : October 4, 2016
INVENTOR(S)      : Tabei Page 1 of 1

It is certified that error appears in the above-identified patent and that said Letters Patent is hereby corrected as shown below:

In the Specification

Column 5, Line 29: please delete "k" and replace it with -- $I_C$ --

Column 8, Line 14: please delete "R" and replace it with -- $R_{KE}$ --

Signed and Sealed this
Seventh Day of February, 2017

Michelle K. Lee
*Director of the United States Patent and Trademark Office*